United States Patent [19]

Rickard et al.

[11] Patent Number: 4,638,183

[45] Date of Patent: Jan. 20, 1987

[54] DYNAMICALLY SELECTABLE POLARITY LATCH

[75] Inventors: Dale A. Rickard; Glen H. Rudelis, both of Manassas, Va.

[73] Assignee: International Business Machines Corporation, Armonk, N.Y.

[21] Appl. No.: 652,257

[22] Filed: Sep. 20, 1984

[51] Int. Cl.$^4$ ............................................. H03K 3/356
[52] U.S. Cl. .............................. 307/291; 307/272 R; 307/279; 307/443; 307/468
[58] Field of Search ............... 307/443, 448, 465, 468, 307/469, 481, 272 R, 272 A, 279, 291; 377/81; 324/73 R; 365/154; 371/25

[56] References Cited

U.S. PATENT DOCUMENTS

| | | | |
|---|---|---|---|
| 4,107,556 | 8/1978 | Stewart et al. | 307/279 X |
| 4,251,739 | 2/1981 | Morozumi | 307/279 X |
| 4,380,055 | 4/1983 | Larson | 365/154 |
| 4,493,077 | 1/1985 | Agrawal et al. | 371/25 |
| 4,495,629 | 1/1985 | Zasio et al. | 307/272 A X |
| 4,506,167 | 3/1985 | Little et al. | 307/279 |
| 4,541,076 | 9/1985 | Bowers et al. | 365/154 X |
| 4,554,465 | 11/1985 | Koike | 307/291 X |
| 4,554,664 | 11/1985 | Schultz | 371/25 |

OTHER PUBLICATIONS

Mead and Conway, *Introduction to VLSI Systems*, Addison-Wesley Pub. Co., Reading, Mass., Oct. 1980, pp. 155–156.

*Primary Examiner*—Larry N. Anagnos
*Assistant Examiner*—D. R. Hudspeth
*Attorney, Agent, or Firm*—John E. Hoel

[57] ABSTRACT

A selective true or complement storage latch is disclosed which includes a data input switch having an input node connecting to a binary bit input source, a control input for accepting a first or second control state, a first data output node which is selectively connected to the data input node when the control input is in the first state and a second data output node which is selectively connected to the data input node when the control input is in the second state. There is also a first inverting gate having an input connected to the first data output of the data input switch and an output connected to a first storage node. The second inverting gate has an input connected to the first storage node and an output connected to the second storage node, the input of the second inverting gate being connected to the second output of the data input switch, the output of the second inverting gate being connected to the input of the first inverting gate. The data input node is selectively connected to the input of the first inverting gate through the first output of the data input switch when the control input is in a first state and the data input node is selectively connected to the input of the second inverting gate through the second output of the data input switch when the control input is in the second state. In this manner the true value of the data at the data input node is stored in the latch when the control input is in the first state and the complement of the data at the data input node is stored in the latch when the control input is in the second state.

15 Claims, 8 Drawing Figures

PRIOR ART

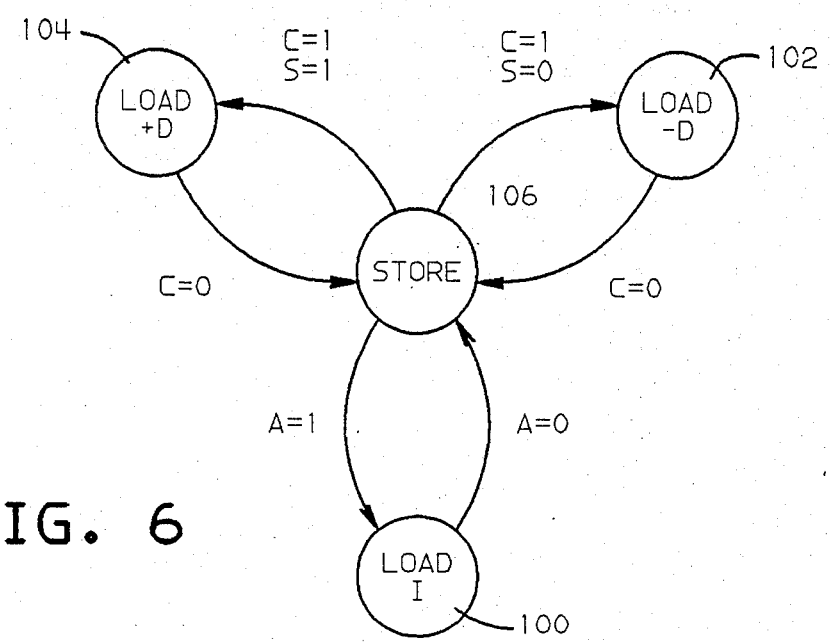
FIG. 6
FIG. 7
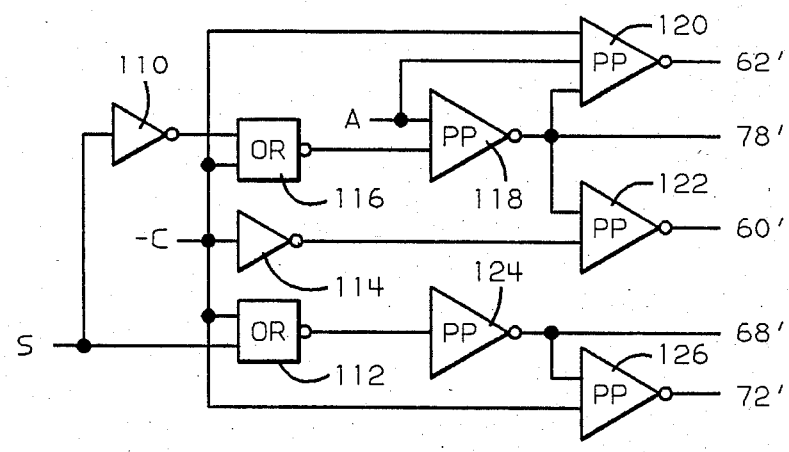

DYNAMICALLY SELECTABLE POLARITY LATCH

DESCRIPTION

1. Field of the Invention

The invention disclosed broadly relates to digital logic circuits and more particularly relates to improvements in storage latches.

2. Background of the Invention

Prior art circuit latches are typically bi-stable devices which have a binary signal input to the device and provide a stored stable binary state at the output of the device. Typical prior art latches will include the standard cross-coupled pair of inverting gates with the first inverting gate's output node corresponding to a first binary stored state and the second inverting gate's output node corresponding to the complement output state. The stored state of the conventional latch is a function of the binary state of the input signal. Given a predetermined binary state, for example a binary one state, the first output node for the latch will always have a first binary state and the second output node of the latch will always have a second binary state when the data is stored in the latch. These binary states are a predetermined, invariant function of the binary state of the input signal.

The problem solved by the invention disclosed herein is how to dynamically select the relationship between the latch output signal polarity and the latch input signal polarity such that the latch can be selected to have a first storage state wherein the output of the first inverting gate has the first binary state and the output of the second inverting gate has the second (complementary) state or second binary storage state wherein the output of the first inverting gate has the second binary state and the output of the second inverting gate has the first (complementary) binary state, in a manner which will not unduly delay the propagation of the signal through the circuit and for which the circuit can be implemented with a minimum number of device elements.

FIG. 1 herein illustrates a prior art approach to achieving the polarity select latch function. In FIG. 1, latch 10 is a conventional latch with data input 12, clock input 14 and true and complement outputs 16 and 18, respectively. In order to achieve the polarity select function for the latch shown in FIG. 1, multiplexers 20 and 22 are provided with the first and second inputs of multiplexer 20 connected to the true output 16 and complement output 18 from the latch 10, respectively while the first and second inputs to multiplexer 22 are connected to the complement output 18 and true output 16 of latch 10, respectively. A select control input 24 to the multiplexers 20 and 22 allows the selection of either the true value or the complement value to be passed from the latch 10 to the first output 26 of the circuit and the complement value or the true value, respectively to be passed from the latch 10 to the second output 28 of the circuit. The problem with the approach shown in FIG. 1 is that the output multiplexers 20 and 22 have a relatively large size, occupying an unnecessarily large area on the integrated circuit chip. The multiplexers 20 and 22 also represent unnecessary additional propagation delay for the signals which must pass through the circuit. Thus, this approach to providing a polarity select latch is unsuitable for implementation in high density VLSI applications.

FIG. 2 represents an alternate prior art approach to providing the polarity select latch function. In FIG. 2, the data input 30 is bifurcated, with a first portion directly applied to a first input of multiplexer 32 and a second portion passed through the inverter 34 so as to apply the complement of the binary input 30 to the second input of the multiplexer 32. By means of operating the select input 33, either the true or complement of the input data 30 can be applied to the data input of the latch 35. The polarity of the data clocked into the latch 35 determines the polarity of the first output 36 and second output 37 with respect to the input data 30, thus accomplishing the polarity select function. In addition to the unnecessarily large size of the multiplexer 32 and the inverter 34, this approach in the prior art suffers from both the multiplexer delay which also occurred in the embodiment of FIG. 1, and an extra inverter delay represented by the inverter 34 in FIG. 2. Thus the prior art approach represented by FIG. 2 imposes excessive propagation delays for the signals applied to the circuit and occupies an unduly large area of the integrated circuit chip.

Large scale integrated circuits and very large scale integrated circuits developed in the prior art proved to be difficult to test because of embedded combinatorial logic positioned between sequential logic elements. The prior art developed the technique of level sensitive scan design (LSSD) in order to test embedded combinatorial logic by means of selectively scanning in sequences of binary bit test patterns into an input latch stage, clocking data through the combinatorial logic for one cycle, and then scanning out the resultant binary bits from an output latch stage connected to the output of the combinatorial logic. This technique has been described in detail, for example in the U.S. Pat. Nos. 3,761,695; 3,783,254; and 3,806,891 by Eichelberger, all assigned to the IBM Corporation.

For reference purposes, FIG. 3 illustrates a field effect transistor embodiment of a conventional LSSD latch pair consisting of the latch L1 which is the master latch and the latch L2 which is the slave latch. As is well-known to the prior art, during normal data operations, it is the D input to the latch L1 which provides the binary bits to the latch which are clocked in at the rate provided by the C clock signal to the latch L1. During the test phase for the circuit, the input I to latch L1 is the input which provides the sequence of binary bit test patterns which are scanned into the latch L1 under control of the scan clock A. Since the latches L1 and L2 are level sensitive, when the B clock goes on, the slave latch L2 gates in and stores the binary value at the output of the master latch L1. In the embodiment shown in FIG. 3, enhancement mode FET devices 40 and 42 serve as transfer gates for respectively transferring either the binary data bits on the D input or the binary test bits on the I input to the input of the inverter 44. The inverter 44 has its output connected to the input of the inverter 48 and the output of the inverter 48 is fed back through the depletion mode FET device 46 to the input of the inverter 44, thereby accomplishing the latching function for the master latch L1. The output of the latch L1, which is the output of the inverter 48, passes through the enhancement mode FET device 50 whose gate is controlled by the B clock. The input of the inverter 52 is connected to the FET 50, the output of the inverter 52 is connected to the input of the inverter 54, whose output is connected through the depletion mode FET device 56 to the input of the inverter 52. In this manner, the latching function is accomplished for the slave latch L2. The true output for the circuit shown in FIG. 4 is the output of the inverter 54 which is referred to as the output +L2. By convention herein, the use of a "+" before a signal reference letter will indicate the true positive logic value of the referenced signal whereas the use of a "−" before a signal reference letter will indicate the complement value of the referenced signal. The complement of the +L2 output is obtained by connecting to the output of the inverter 52 of the L2 latch, and that complement output is referred to as the −L2 output. As can be seen from FIG. 3, the LSSD latch is of the conventional type and does not provide for any dynamically selectable polarity of the output.

As can be seen from the above, there is a clear need in the prior art for a faster and less expensive implementation of a latch with dynamically selectable polarity of the output, which is compatible with level sensitive scan design testing techniques.

OBJECTS OF THE INVENTION

It is therefore an object of the invention to provide an improved latch circuit.

It is another object of the invention to provide an improved dynamically selectable polarity latch.

It is still a further object of the invention to provide an improved dynamically selectable polarity latch which occupies less space than has been required in the prior art.

It is still a further object of the invention to provide an improved dynamically selectable polarity latch, which has less signal propagation delay than has been suffered by circuits in the prior art.

It is still a further object of the invention to provide an improved dynamically selectable polarity latch which is compatible with level sensitive scan design techniques.

It is yet a further object of the invention to provide an improved dynamically selectable polarity latch which is compatible with level sensitive scan design testing techniques and yet is faster and occupies less space than has been available with circuits in the prior art.

DESCRIPTION OF THE FIGURES

These and other objects, features and advantages of the invention will be more fully appreciated with reference to the accompanying figures.

FIG. 6 is a state diagram illustrating the operation of the logic circuit of FIG. 4, in accordance with the invention.

FIG. 7 is a logic diagram of a second embodiment of a clock decoder for providing appropriate clock signals to the switching elements of the circuit in FIG. 4.

DISCUSSION OF THE PREFERRED EMBODIMENT

Figure 1:
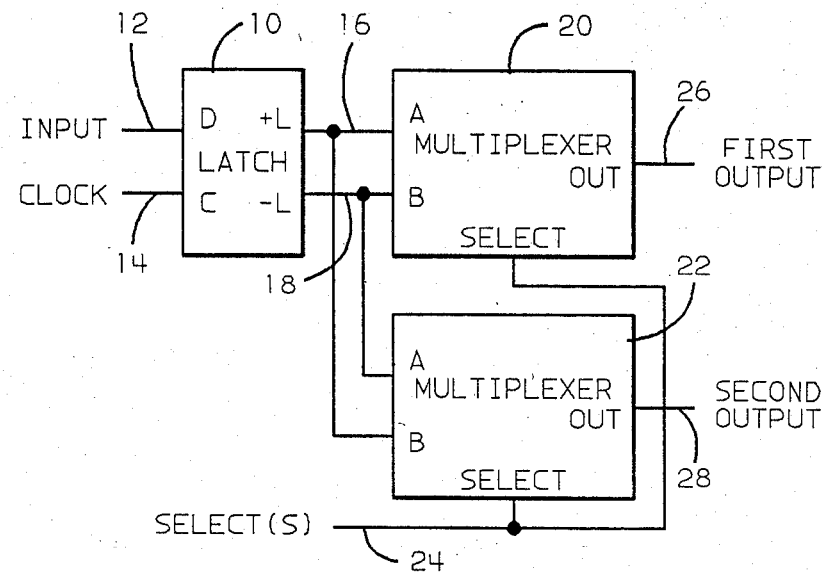
FIG. 1 illustrates a first prior art approach to providing a polarity select latch which is compatible with level sensitive scan design techniques.
Figure 2:
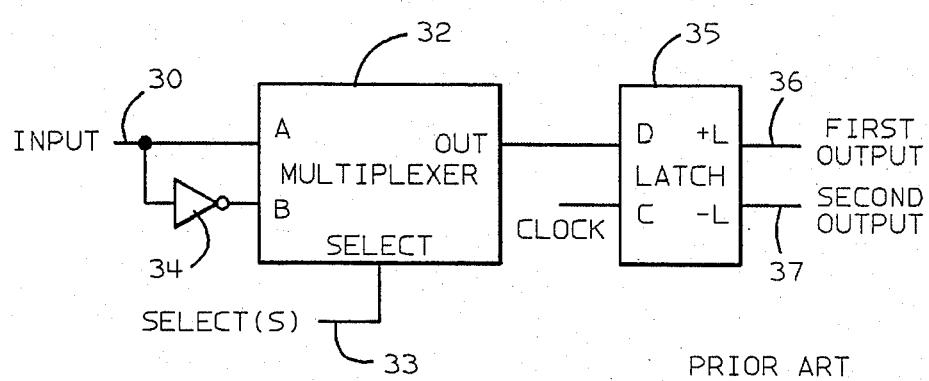
FIG. 2 is another prior art approach providing a polarity select latch which is compatible with level sensitive scan design techniques.
Figure 3:
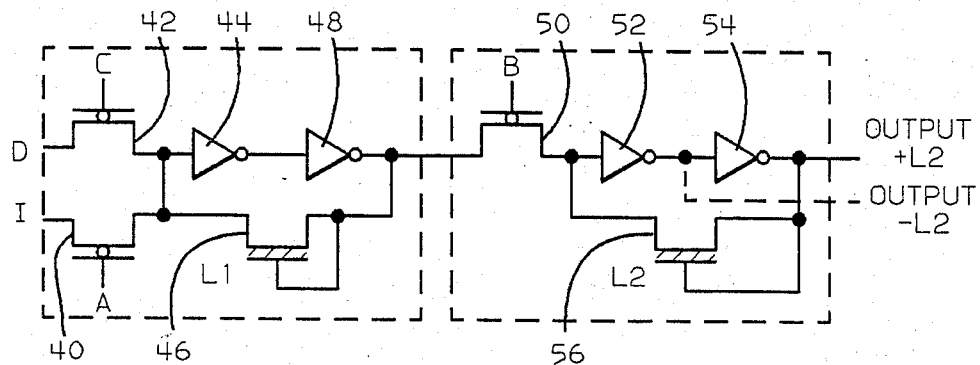
FIG. 3 is a circuit schematic diagram of a field effect transistor level sensitive scan design latch circuit in the prior art.
Figure 4:
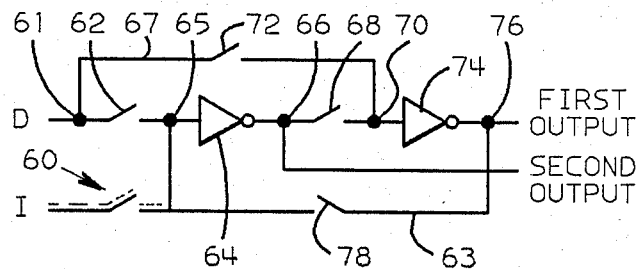
FIG. 4 is a logic diagram of the invention, illustrating the generalized topology of a dynamically selectable polarity latch in accordance with the invention. The circuit shown in FIG. 4 can be adapted to level sensitive scan design by including the optional switch 60 connecting the scan data input I as shown in the dotted line connection of FIG. 4, so that the circuit of FIG. 4 would form the master latch whose output would be connected to a conventional slave latch for level sensitive scan design testing applications.

Reference will now be made to the logic diagram of FIG. 4 illustrating the general topology embodiment of the invention. The operation of the circuit of FIG. 4 will be described in a level sensitive scan design application and therefore the switch 60 shown in dotted lines and its input I of FIG. 4, will be included. FIG. 4 will be discussed in conjunction with the logic diagram of the first embodiment of the clock signal decoder shown in FIG. 5 and also in conjunction with the state diagram of FIG. 6 which illustrates the sequential operation of the circuit of FIG. 4 under the control of the circuit of FIG. 5.

Figure 5:
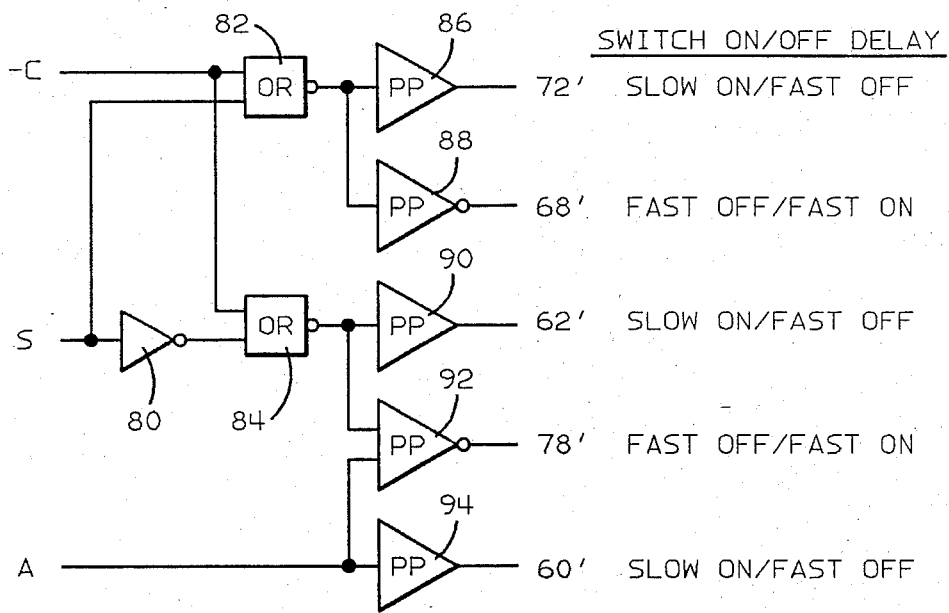
FIG. 5 is a logic diagram of an example first embodiment of a clock signal decoder, for providing clock signals to the various switching elements of the logic circuit shown in FIG. 4.

Table 1 is a truth table which illustrates the various states of the circuit of FIG. 4 under the control of the clocking circuit of FIG. 5, in accordance with the state diagram of FIG. 6.

TABLE 1

| Latch | Switch State* | | | | | Control & Clock** | | |
| --- | --- | --- | --- | --- | --- | --- | --- | --- |
| State | 72' | 62' | 60' | 68' | 78' | C | A | S |
| Load +D | Op | Cl | Op | Cl | Op | 1 | 0 | 1 |
| Load −D | Cl | Op | Op | Op | Cl | 1 | 0 | 0 |
| Load I | Op | Op | Cl | Cl | Op | 0 | 1 | — |
| Store | Op | Op | Op | Cl | Cl | 0 | 0 | — |

*Switch State: Op = Open and Cl = Closed
**Control & Clock: C = C-Clock; A = A-Clock; and S = Select In FIG. 4, the circuit can be embodied in field effect transistor devices as the preferred embodiment. However, the circuit can also be embodied in other transistor technology such as bipolar transistors or other switching elements. In FIG. 4, the primary data input D has its node 61 connected through the switch 62 to the node 65. The switch 62 is operated under the control of the output node 62' of the clocking circuit of FIG. 5. Node 65 of FIG. 4 is input to the inverter 64 whose output at node 66, passes through the switch 68 to the input of the inverter 74. Switch 68 is operated under the control of the output node 68' of the clocking circuit of FIG. 5. The output of the inverter 74 in FIG. 4 is connected to the output node 76 which is the first output node for the circuit. The node 76 is also connected through the feedback path 63 to the switch 78. The switch 78 is operated from the output node 78' of the clocking circuit of FIG. 5. The feedback path 63 proceeds through the switch 78 in FIG. 4 to the node 65 at the input to the inverter 64.

An alternate data path 67 is connected to the input node 61 in FIG. 4, and through the switch 72 to the node 70 at the input of the inverter 74. Switch 72 is controlled by the output node 72' of the clocking circuit of FIG. 5. A second output for the circuit can be connected to the node 66 in FIG. 4.

The overall operation of the circuit in FIG. 4 is as follows. Initially the switches 62 and 68 are closed so that data can be applied to the primary data input D to the latch. During this initial interval, the switch 72 and the switch 78 are open. Thereafter, after the input data has been applied through the inverter 64 and the inverter 74 to the feedback line 63, the switch 62 is opened and the switch 78 is closed, thereby completing the feedback path from the node 76 to the node 65. In this manner, data input at the input node 61 can be latched and stored by the circuit. Both the true and the complement binary value of the bit of information stored in the circuit can be made available, the first output at node 76 being identical in polarity to the bit stored at the input node 61, and the complement of that value being available at the node 66 for the second output of the circuit. For discussion herein, the sense of the latch in FIG. 4 under this condition is to be called the first sense.

In accordance with the invention, to provide the dynamically selectable polarity latch function, the same binary bit applied to the input node 61 can set the latch of FIG. 4 in the opposite sense. This is accomplished as follows. Initially, switch 72 will be closed and switch 78 will be closed while during the same interval, switch 62 will be open and switch 68 will be open. The binary bit input at the primary data input D at node 61 is applied through the alternate path 67. The binary signal is propagated through the switch 72 to the node 70 which is the input to the inverter 74. The inverter signal is then applied over the feedback path 63 and through the switch 78 to the node 65. The node 65 is the input to the inverter 64 and the signal is then passed through the inverter 64 to the node 66. After this first interval, the switch 72 is opened and the switch 68 is closed. Thus, the sense of the latch, which is opposite to the sense described in the previous paragraph, is stored by providing a positive reinforced feedback of the signal through the switch 68 and the switch 78 and the inverters 64 and 74. In this second stored sense of the latch of FIG. 4, the first output node 76 has the complement of the binary value input at the primary data input D whereas the second output at the node 66 has the true value of the binary value input at the input node 61.

Thus it can be seen that by proper combinations of the closure of the switches in the latch of FIG. 4, a dynamically selectable polarity latch operation can be achieved in a very efficient manner.

The latch of FIG. 4 can also be applied in a very economic way to level sensitive scan design testing applications. This is achieved by including the switch 60 which is connected between the node 65 and the scan data input I. During testing intervals when LSSD operation is desired, the LSSD scan bits are applied at the input node I in a manner similar to the application of the primary data bits at the input node 61 described above. In order to separate the primary data input D from the latch while the scan data is loaded into the latch, the switches 62 and 72 are open. The scan test data is applied at node 65 and through the inverter 64 and through the closed switch 68 to the input of the inverter 74. The output of the inverter 74 is passed over the feedback path 63. At this point, the switch 60 is opened and the switch 78 is closed so as to enable the feedback path 63 to be completed from node 76 to the node 65, thereby latching the scan test data input by the scan data input I.

Turning now to the clocking decoder circuit of FIG. 5, a select input S is directly applied to one input of the NOR gate 82 and is applied through an inverter 80 to one input of the NOR gate 84. The other input of the NOR gate 82 is connected to a periodic clock waveform −C. The clock input −C is also applied to the second input of the NOR 84. The output of the NOR 82 is applied through a true push-pull driver circuit 86 as the clock output 72'. The output of the NOR gate 82 is also applied through a complement push-pull driver circuit 88 whose output is 68'. The output of the NOR gate 84 is directly applied through the true push-pull driver 90 and its output is 62'. The output of the NOR gate 84 is also applied as one input to the NOR gate 92 whose output is 78'. The circuit of FIG. 5 has an A clock input which is applied as second input to the NOR 92. The A clock is also directly applied to the true push-pull driver 94 whose output is 60'. The outputs of the clock decoder circuit of FIG. 5 are applied to the corresponding unprimed switches of the logic circuit of FIG. 4, as was described above.

The A clock circuit is used only for those applications of the latching circuit of FIG. 4 to level sensitive scan design testing.

Referring now to the state diagram of FIG. 6, in the state 104 (load +D), the primary data input 61 has a binary value applied to it, and the state of the switches is shown in Table 1. In addition, the state of the clock signals is also shown in Table 1.

Alternately to load the opposite binary state from that being applied at the input node 61, state 102 is employed. State 102 which is indicated as load −D has its condition shown in Table 1 with the corresponding switch states and the clock signal states.

The LSSD application state is shown as the load I state 100 and its respective switch states and clock signal states are shown in Table 1.

Finally, when information from either the load +D, load −D or load I states is to be stored, the stored state condition is shown in Table 1 corresponding to the stored state 106 of FIG. 6.

FIG. 7 is a logic diagram of a second embodiment to the clock driver decoder which can be used for driving the generalized topology circuit of FIG. 4. The select input S is applied through the inverter 110 to one input of the NOR gate 116, the other input to the NOR gate being applied from the clock signal −C. The output of the NOR gate 116 is applied as a first input to the inverting push-pull driver 118, the second input coming from the A clock. The output of the inverting push-pull driver 118 is the output 78' of the circuit. The A clock is also applied as one input of the inverting push-pull driver 120, the other input of which the output from the inverting push-pull driver 118. The clock input waveform −C is optionally applied as the third input to the inverting push-pull driver 120. The output of the inverting push-pull driver 120 is the output 62'. The clock input waveform −C is also applied through the inverter 114 whose output is applied as one input to the NOR gate 122, the other input of which comes from the inverting push-pull driver 118. The output of the inverting push-pull driver 122 is the output 60'. The select S input is also applied as one input to the NOR gate 112, the other input of which is connected to the clock waveform input −C. The output of the NOR gate 112 is applied through the inverting push-pull driver 124, whose output is the output 68'. The output of the inverting push-pull driver 124 is also applied as one input to the inverting push-pull output 126, the other input of which is optionally connected to the input clock waveform −C. The output of the push-pull inverter 126 is the output 72'.

In the circuit of FIG. 5, use is made of the inherent delay in each respective gate so that no race conditions occur. The overall operation of the circuit of FIG. 7 is identical to that of the circuit of FIG. 5 and the sequence of clock waveform or enabling signal waveforms output from each respective circuit is substantially the same. The circuit of FIG. 5 and the circuit of FIG. 7 are typically used to drive multiple polarity select latches so that the space required to implement the clock decoding is apportioned over a number of latches and thus is not excessive.

Figure 8:
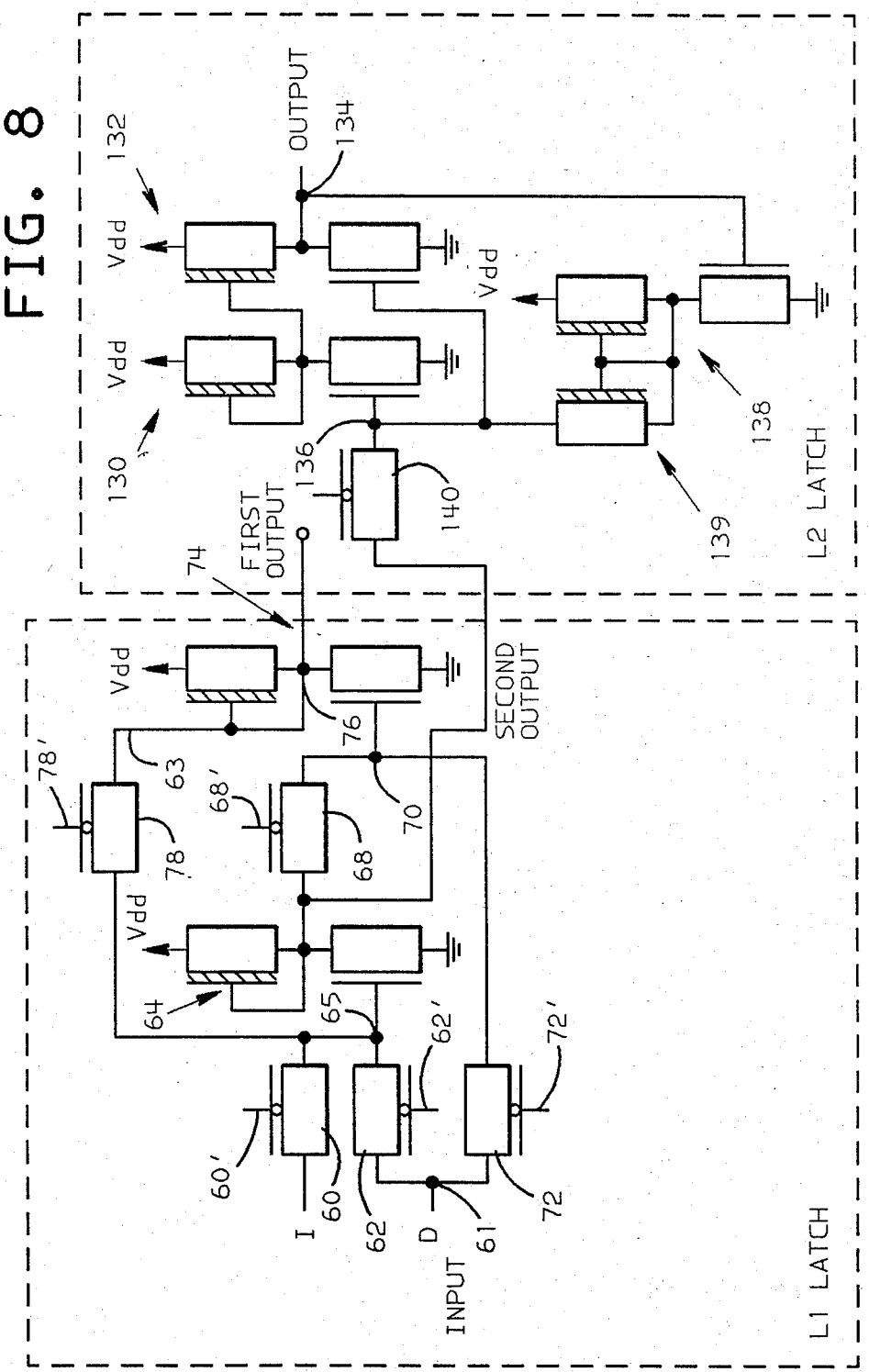
FIG. 8 is a detailed circuit schematic diagram illustrating a dynamically selectable polarity latch in accordance with the invention, which is employed as the L1 latch in a level sensitive scan design application. An example of an L2 slave latch whose input is connected to the output of the L1 master latch is also shown in FIG. 8.

Attention is now turned to FIG. 8 which is a detailed FET circuit diagram of the L1 latch in accordance with the invention. The embodiment is shown in combination with an L2 latch for an LSSD application. In FIG. 8, FET transistors are numbered so as to correspond with the switch and inverter elements shown in FIG. 4. In addition, the various paths and nodes are identically numbered to the corresponding paths and nodes in FIG. 4. The operation of the circuit is identical to the operation of the circuit shown for the general topology of FIG. 4. Use has been made of zero threshold voltage FET devices for the devices 60, 62 and 72, 68 and 78 in FIG. 8 in order to reduce the threshold voltage drop which is normally suffered through FET transfer gate devices. The inverter 64 comprises an enhancement mode/depletion mode FET inverter circuit, as does the inverter circuit 74.

The L2 latch shown in FIG. 8 contains a pair of enhancement mode/depletion mode FET inverters 130 and 132 which are connected in the conventional push-pull inverter configuration. The feedback path from the output node 134 passes through an enhancement mode/depletion mode inverter stage 138 and an FET depletion mode feedback resistor 139, to the input node 136. The operation of the L2 latch is conventional. The B clock is applied to the gate of the zero threshold voltage FET device 140 which connects the L2 latch to the L1 latch as is shown in FIG. 8.

The resulting dynamically selectable polarity hold latch shown in FIG. 4 and embodied in the L1 latch shown in FIG. 8, can be applied in arithmetic circuits where it is desired to use the same arithmetic circuitry for performing either an add operation or a subtract operation, for example. By selectively controlling the data stored in the input latch to an adder so that the operand either represents the true or the one's complement of the input data, an add operation or alternately a subtract operation can be effectively carried out with the same circuitry. Still further, the resulting dynamically selectable polarity latch requires fewer logic elements than have been necessary in the prior art and is faster in operation and occupies less real estate on the integrated circuit chip than has been required in the prior art in order to accomplish the same function.

Still further, the level sensitive scan design testing feature which can be achieved by the dynamically selectable polarity latch invention, adds an additional function not capable of performance in prior art circuits.

Although the specific implementation of the invention has been disclosed as N channel FET technology, equivalent implementations can be in P channel FET, complementary FET, and bipolar transistor technologies.

Although a specific embodiment of the invention has been disclosed, it will be understood by those of skill in the art that the foregoing and other changes in form and details may be made therein without departing from the spirit and the scope of the invention.

We claim:

1. A selective true or complement storage latch, comprising:
   a data input switch having a first input node which can assume either a zero or a one value, connecting to a binary bit input source, a control input for accepting a first or second control state signals, a first data output node which is selectively connected to said data input node when said control input is in said first state and a second data output node which is selectively connected to said data input node when said control input is in said second state;
   a first inverting gate having an input connected to said first data output of said data input switch and an output connected to a first storage node;
   a second inverting gate having an input coupled to said first storage node and an output coupled to a second storage node, said input of said second inverting gate being connected to said second output of said data input switch, said output of said second inverting gate being coupled to said input of said first inverting gate;
   said data input node being selectively connected to said input of said first inverting gate through said first output of said data input switch when said control input is in a first state and said data input node being selectively connected to said input of said second inverting gate through said second output of said data input switch when said control input is in said second state;
   whereby the true value of the data at said data input node is stored in said latch when said control input is in said first state and the complement of the data at said data input node is stored in said latch when said control input is in said second state.

2. A selective true or complement storage latch, comprising:
   a first data input switch having a first input node which can assume either a zero or a one value, connecting to a binary bit input source, a first control input for accepting a first or second control state signals, a first data output node which is selectively connected to said data input node when said first control input is in said first state and which is selectively disconnected from said first data input node when said first control input is in said second state;
   a second data input switch having a second input node connecting to said binary bit input source, a second control input for accepting a third or fourth control state signals, a second data output node which is selectively connected to said second data input node when said second control input is in said third state and which is selectively disconnected from said second data input node when said second control input is in said fourth state;

a first inverting gate having an input connected to said first data output of said first data input switch and an output connected to a first storage node;

a second inverting gate having an input coupled to said first storage node and an output coupled to a second storage node, said input of said second inverting gate being connected to said second output of said second data input switch, said output of said second inverting gate being coupled to said input of said first inverting gate;

said binary bit input node being selectively connected to said input of said first inverting gate through said first output of said first data input switch when said first control input is in said first state and said binary bit input node being selectively connected to said input of said second inverting gate through said second output of said second data input switch when said second control input is in said third state;

whereby the true value of the data at said data input node is stored in said latch when said control input is in said first state and the complement of the data at said data input node is stored in said latch when said second control input is in said third state.

3. The apparatus of claim 2, which further comprises:

a third switch having an input coupled to said first storage node, a control input for accepting a control state signal, and an output which is selectively connected to said input of said second inverting gate when said control input thereof is in a first enabling state and which is selectively disconnected from said input of said second inverting gate when said control input thereof is not in said first enabling state;

a fourth switch having an input connecting to said second storage node, a control input for accepting a control state signals, and an output which is selectively connected to said input of said first inverting gate when said control input thereof is in a second enabling state and which is selectively disconnected from said input of said first inverting gate when said control input thereof is not in said second enabling state.

4. The apparatus of claim 3, wherein said first and third switches are conductive and said second and fourth switches are nonconductive to store the true value of the data at said data input node in said latch.

5. The apparatus of claim 3, wherein said second and fourth switches are conductive and said first and third switches are nonconductive to store the complement value of the data at said data input node in said latch.

6. The apparatus of claim 2, which further comprises:

a test input switch having a first input node connecting to a level sensitive scan design test bit input source, a test control input for accepting a control state signal, and an output node which is selectively connected to said test input node when said control input thereof is in a first state and which is selectively disconnected from said test input node when said control input thereof is in a second state.

7. A selective true or complement storage latch, comprising:

a first data input FET having an input node which can assume either a zero or a one value, connecting to a binary bit input source, a control input for accepting a control state signal, and an output node which is selectively connected to said data input node when said control input is in a first state and which is selectively disconnected from said data input node when said control input is in a second state;

a second data input FET having an input node connecting to said binary bit input source, a control input for accepting a control state signal, and an output node which is selectively connected to said data input node when said control input thereof is in a third state and which is selectively disconnected from said data input node when said control input thereof is in a fourth state;

a first inverting gate having an input connected to said output of said first data input FET and an output connected to a first storage node;

a second inverting gate having an input coupled to said first storage node and an output coupled to a second storage node, said input of said second inverting gate being connected to said output of said second data input FET, said output of said second inverting gate being coupled to said input of said first inverting gate;

said binary bit input node being selectively connected to said input of said first inverting gate through said output of said first data input FET when said control input thereof is in said first state and said binary bit input node being selectively connected to said input of said second inverting gate through said output of said second data input FET when said control input is in said third state;

whereby the true value of the data at said data input node is stored in said latch when said first data input FET is conductive and the complement of the data at said data input node is stored in said latch when said second data input FET is conductive.

8. The apparatus of claim 7, which further comprises:

a third FET having an input coupled to said first storage node, a control input for accepting a control state signal, and an output which is selectively connected to said input of said second inverting gate when said control input thereof is in a first enabling state and which is selectively disconnected from said input of said second inverting gate when said control input thereof is not in said first enabling state;

a fourth FET having an input connecting to said second storage node, a control input for accepting a control state signal, and an output which is selectively connected to said input of said first inverting gate when said control input thereof is in a second enabling state and which is selectively disconnected from said input of said first inverting gate when said control input thereof is not in said second enabling state.

9. The apparatus of claim 8, wherein said first and third FETs are conductive and said second and fourth FETs are nonconductive to store the true value of the data at said data input node in said latch.

10. The apparatus of claim 8, wherein said second and fourth FETs are conductive and said first and third FETs are nonconductive to store the complement value of the data at said data input node in said latch.

11. The apparatus of claim 7, which further comprises:

a test input FET having a first input node connecting to a level sensitive scan design test bit input source, a test control input for accepting a control state, and an output node which is selectively connected to said test input node when said control input thereof is in a first state and which is selectively disconnected from said test input node when said control input thereof is in a second state.

12. A selective true or complement storage latch, comprising:
a first data input switch having a first input node connecting a binary bit input source, a first control input for accepting a first or second control state signals, a first data output node which is selectively connected to said data input node when said first control input is in said first state and which is selectively disconnected from said first data input node when said first control input is in said second state;
a second data input switch having a second input node connecting to said binary bit input source, a second control input for accepting a third or fourth control state signals, a second data output node which is selectively connected to said second data input node when said second control input is in said third state and which is selectively disconnected from said second data input node when said second control input is in said fourth state;
a first inverting gate having an input connected to said first data output of said first data input switch and an output connected to a first storage node;
a second inverting gate having an input coupled to said first storage node and an output coupled to a second storage node, said input of said second inverting gate being connected to said second output of said second data input switch, said output of said second inverting gate being coupled to said input of said first inverting gate;
said binary bit input node being selectively connected to said input of said first inverting gate through said first output of said first data input switch when said first control input is in said first state and said binary bit input node being selectively connected to said input of said second inverting gate through said second output of said second data input switch when said second control input is in said third state;
a third switch having an input coupled to said first storage node, a control input for accepting a control state signal, and an output which is selectively connected to said input of said second inverting gate when said control input thereof is in a first enabling state and which is selectively disconnected from said input of said second inverting gate when said control input thereof is not in said first enabling state;
a fourth switch having an input connecting to said second storage node, a control input for accepting a control state signal, and an output which is selectively connected to said input of said first inverting gate when said control input thereof is in a second enabling state and which is selectively disconnected from said input of said first inverting gate when said control input thereof is not in said second enabling state;
a test input switch having a first input node connecting to a level sensitive scan design test bit input source, a test control input for accepting a control state signal, and an output node which is selectively connected to said test input node when said control input thereof is in a first state and which is selectively disconnected from said test input node when said control input thereof is in a second state;
whereby the true value of the data at said data input node is stored in said latch when said control input is in said first state and the complement of the data at said data input node is stored in said latch when said second control input is in said third state.

13. The apparatus of claim 12, wherein said test switch and said third switch are conductive and said first, second and fourth switches are nonconductive to store the true value of the level sensitive scan design test bit at said test bit input in said latch.

14. A selective true or complement storage latch, comprising:
a first data input FET having an input node connecting to a binary bit input source, a control input for accepting a control state signal, and an output node which is selectively connected to said data input node when said control input is in a first state and which is selectively disconnected from said data input node when said control input is in a second state;
a second data input FET having an input node connecting to said binary bit input source, a control input for accepting a control state signal, and an output node which is selectively connected to said data input node when said control input thereof is in a third state and which is selectively disconnected from said data input node when said control input thereof is in a fourth state;
a first inverting gate having an input connected to said output of said first data input FET and an output connected to a first storage node;
a second inverting gate having an input coupled to said first storage node and an output coupled to a second storage node, said input of said second inverting gate being connected to said output of said second data input FET, said output of said second inverting gate being coupled to said input of said first inverting gate;
said binary bit input node being selectively connected to said input of said first inverting gate through said output of said first data input FET when said control input thereof is in said first state and said binary bit input node being selectively connected to said input of said second inverting gate through said output of said second data input FET when said control input thereof is in said third state;
a third FET having an input coupled to said first storage node, a control input for accepting a control state signal, and an output which is selectively connected to said input of said second inverting gate when said control input thereof is in a first enabling state and which is selectively disconnected from said input of said second inverting gate when said control input thereof is not in said first enabling state;
a fourth FET having an input connecting to said second storage node, a control input for accepting a control state signal, and an output which is selectively connected to said input of said first inverting gate when said control input thereof is in a second enabling state and which is selectively disconnected from said input of said first inverting gate when said control input thereof is not in said second enabling state;
a test input FET having a first input node connecting to a level sensitive scan design test bit input source, a test control input for accepting a control state signal, and an output node which is selectively connected to said test input node when said control input thereof is in a first state and which is selectively disconnected from said test input node when said control input thereof is in a second state.

whereby the true value of the data at said data input node is stored in said latch when said first data input FET is conductive and the complement of the data at said data input node is stored in said latch when said second data input FET is conductive.

15. The apparatus of claim 14, wherein said test FET and said third FET are conductive and said first, second and fourth FETs are nonconductive to store the true value of the level sensitive scan design test bit at said test bit input in said latch.

* * * * *